US012702028B2

(12) United States Patent
Dabral et al.

(10) Patent No.: US 12,702,028 B2
(45) Date of Patent: Aug. 4, 2026

(54) SEMICONDUCTOR PACKAGE WITH LOCAL INTERCONNECT AND CHIPLET INTEGRATION

(71) Applicant: Apple Inc., Cupertino, CA (US)

(72) Inventors: Sanjay Dabral, Cupertino, CA (US); Jun Zhai, Cupertino, CA (US); Kunzhong Hu, Cupertino, CA (US); SivaChandra Jangam, Milpitas, CA (US); Zhitao Cao, Campbell, CA (US)

(73) Assignee: Apple Inc., Cupertino, CA (US)

( * ) Notice: Subject to any disclaimer, the term of this patent is extended or adjusted under 35 U.S.C. 154(b) by 574 days.

(21) Appl. No.: 18/296,587

(22) Filed: Apr. 6, 2023

(65) Prior Publication Data

US 2024/0105626 A1 Mar. 28, 2024

Related U.S. Application Data

(60) Provisional application No. 63/376,859, filed on Sep. 23, 2022.

(51) Int. Cl.
*H10W 70/65* (2026.01)
*H10D 1/68* (2025.01)
(Continued)

(52) U.S. Cl.
CPC ............. *H10W 70/65* (2026.01); *H10D 1/68* (2025.01); *H10W 70/611* (2026.01); *H10W 70/685* (2026.01); *H10W 70/69* (2026.01)

(58) Field of Classification Search
None
See application file for complete search history.

(56) References Cited

U.S. PATENT DOCUMENTS 10,074,630 B2    9/2018 Kelly et al.
10,742,217 B2    8/2020 Dabral et al.
(Continued)

FOREIGN PATENT DOCUMENTS

KR    20070009846 A    1/2007
KR    20220114391 A    1/2007
(Continued)

OTHER PUBLICATIONS

PCT/US2023/031874, "PCT Notification of Transmittal of the International Search Report and the Written Opinion fo the International Searching Authority, or the Declaration", mailed Dec. 27, 2023, 9 pages.
NeXolve, "Novastrat 905 Polyimide", received from https://nexolve.com/wp-content/uploads/2021/10/TDS_Novastrat_905.pdf, 2021, 2 pages.
NeXolve, "Low & Zero CTE Polyimides, Novastrat 800" Received from https://nexolve.com/advanced-materials/low-zero-cte-polyimides/, 2023.
(Continued)

*Primary Examiner* — Dale E Page
*Assistant Examiner* — Patrick Cullen
(74) *Attorney, Agent, or Firm* — Aikin & Gallant, LLP

(57) ABSTRACT

Semiconductor packages including local interconnects and methods of fabrication are described. In an embodiment, a local interconnect is fabricated with one or more cavities filled with a low-k material or air gap where a die-to-die routing path electrically connecting the first die and the second die includes the metal wire spanning across the one or more cavities. In other embodiments fanout can be utilized to create a wider bump pitch for the local interconnect, or for the local interconnect to connect core regions of the dies. Multiple local interconnects can also be utilized to scale down electrostatic discharge.

26 Claims, 10 Drawing Sheets

(51) Int. Cl.

| | |
|---|---|
| *H10W 70/60* | (2026.01) |
| *H10W 70/685* | (2026.01) |
| *H10W 70/69* | (2026.01) |

(56) References Cited

U.S. PATENT DOCUMENTS

| | | | |
|---|---|---|---|
| 10,756,622 B2 | 8/2020 | Dabral et al. | |
| 10,950,550 B2 * | 3/2021 | Qian ...................... | H10W 70/65 |
| 11,101,732 B2 | 8/2021 | Dabral et al. | |
| 11,139,264 B2 | 10/2021 | Jain et al. | |
| 11,215,753 B2 | 1/2022 | Islam et al. | |
| 11,309,246 B2 | 4/2022 | Dabral et al. | |
| 2007/0013392 A1 | 1/2007 | Kim et al. | |
| 2015/0371951 A1 | 12/2015 | Yeh et al. | |
| 2016/0297673 A1 * | 10/2016 | Lagouge ............. | G01P 15/0802 |
| 2017/0103943 A1 | 4/2017 | Hu | |
| 2020/0294921 A1 | 9/2020 | Liu et al. | |
| 2021/0159180 A1 | 5/2021 | Zhai et al. | |
| 2021/0265275 A1 | 8/2021 | Rubin et al. | |
| 2022/0014095 A1 | 1/2022 | Dabral et al. | |
| 2022/0102280 A1 | 3/2022 | Dabral et al. | |
| 2022/0199562 A1 | 6/2022 | Waidhas et al. | |
| 2022/0223530 A1 * | 7/2022 | Yu ............................ | H10P 72/74 |
| 2022/0223534 A1 | 7/2022 | Lin et al. | |
| 2022/0254721 A1 | 8/2022 | Pietambaram et al. | |
| 2022/0254756 A1 * | 8/2022 | Choi ..................... | H10W 90/00 |
| 2022/0285273 A1 | 9/2022 | Dabral et al. | |

FOREIGN PATENT DOCUMENTS

| | | |
|---|---|---|
| KR | 20150145165 A | 12/2015 |
| KR | 20220103003 A | 7/2022 |

OTHER PUBLICATIONS

Yin et al., "Copolyamide-Imide Membrane with Low CTE and CME for Potential Space Optical Applications", Received from https://www.mdpi.com/2073-4360/13/7/1001, Published: Mar. 24, 2021, 11 pages.

Hasegawa et al., "Low-CTE Polyimides Derived from 2,3,6,7-Naphthalenetetracarboxylic Dianhydride", Received from https://www.nature.com/articles/pj200783, Published: Apr. 27, 2007, 12 pages.

Silex Microsystems, "TGV-CAP™", Received from https://silexmicrosystems.com/mems-foundry/key-technologies/tgv-cap/, 2023, 2 pages.

Yang et al., "Ultrahigh thermal-stability polyimides with low CTE and required flexibility by formation of hydrogen bonds between poly(amic acid)s" received from https://www.sciencedirect.com/science/article/abs/pii/S0014305721001038, European Polymer Journal, vol. 148, Apr. 5, 2021, 10 pages.

Gomes et al., "Ponte Vecchio: A Multi-Tile 3D Stacked Processor for Exascale Computing", received from https://ieeexplore.ieee.org/document/9731673, Feb. 20-26, 2022, 3 pages.

Hu et al., "Process Development to Enable 3D IC Multi-Tier Die Bond for 20 µM Pitch and Beyond", received from https://ieeexplore.ieee.org/document/6897342, May 27-30, 2014, 4 pages.

Qian et al., "Superheat-resistant polyimides with ultra-low coefficients of thermal expansion", received from https://www.sciencedirect.com/science/article/abs/pii/S0032386120303141, Polymer vol. 196, May 20, 2020, 8 pages.

Daniel Dreps, "The 3rd Generation of IBM's Elastic Interface on POWER6TM", received from https://ieeexplore.ieee.org/document/7482489/metrics#metrics, Aug. 16, 2007, 16 pages.

* cited by examiner

SEMICONDUCTOR PACKAGE WITH LOCAL INTERCONNECT AND CHIPLET INTEGRATION

RELATED APPLICATIONS

This application claims the benefit of priority of U.S. Provisional Application No. 63/376,859 filed Sep. 23, 2022, which is incorporated herein by reference.

BACKGROUND

Field

Embodiments described herein relate to semiconductor packaging, and more particularly to die-to-die interconnection.

Background Information

The current market demand for portable and mobile electronic devices such as mobile phones, personal digital assistants (PDAs), digital cameras, portable players, gaming, and other mobile devices requires the integration of more performance and features into increasingly smaller spaces. As a result, multiple-die packaging solutions such as multi-chip module (MCM), multi-chip integrated fan-out, system in package (SiP) and package on package (PoP) are moving toward more complex arrangements with finer routing requirements to connect multiple dies efficiently. Various 2.5D and 3D packaging solutions in particular have been proposed as multi-die packaging solutions to connect adjacent die within a single package.

SUMMARY

Various semiconductor package structures including local interconnects and methods of manufacture are described in which the local interconnects can be used to provide die-to-die interconnection. In some implementations the local interconnects can be formed of low dielectric constant (low-k) materials or include cavities that can be filled with low-k materials or air. In an embodiment, a semiconductor package includes a first die, a second die, and a local interconnect electrically connecting the first die and the second die. The local interconnect may include a base layer and a routing layer supported by the base layer, where the routing layer includes a metal wire spanning across a cavity in the routing layer. A die-to-die routing path can then electrically connect the first die and the second die with the metal wire spanning across the cavity.

In another implementation fanout can be utilized to create a wider bump pitch for the local interconnect. In an embodiment, a semiconductor package includes a first die that includes a first plurality of contact pads over a first input/output region adjacent a first edge of the first die, a second die that includes a second plurality of contact pads over a second input/output region adjacent a second edge of the second die, and a redistribution layer (RDL) spanning over the first die and the second die. The RDL may include a plurality of landing pads electrically connected to the first plurality of contact pads and the second plurality of contact pads, where the plurality of landing pads is characterized by a larger pad pitch between pads than the first plurality of contact pads and the second plurality of contact pads. In the embodiment, a local interconnect is bonded to the plurality of landing pads of the RDL.

In another implementation fanout can be utilized to connect core regions of the dies. In an embodiment, a semiconductor package includes a first die with a first plurality of contact pads over a first input/output region along a central axis of the first die, a second die with a second plurality of contact pads over a second input/output region of the second die, and a redistribution layer (RDL) spanning over the first die and the second die. The RDL may include a plurality of landing pads that are electrically connected to the first plurality of contact pads and the second plurality of contact pads with fanout wiring. In an embodiment, a local interconnect is connected to the plurality of landing pads of the RDL, the local interconnect is characterized by a longitudinal length spanning across the first die and the second die, and the fanout wiring of the RDL is orthogonal to the longitudinal length.

In yet another implementation multiple local interconnects can be utilized to scale electrostatic discharge (ESD). In an embodiment, a plurality of separate local interconnects is used to electrically connect the first die and the second die, where each separate local interconnect includes a base layer and a routing layer supported by the base layer, the routing layer including die-to-die routing electrically connecting the first die and the second die. In this manner, a larger local interconnect can be divided into smaller local interconnect chiplets thereby reducing the ESD charge accumulation, subsequently reducing ESD protection requirement on the input/output (I/O) circuits of the dies and/or local interconnects.

DETAILED DESCRIPTION

Figure 1:
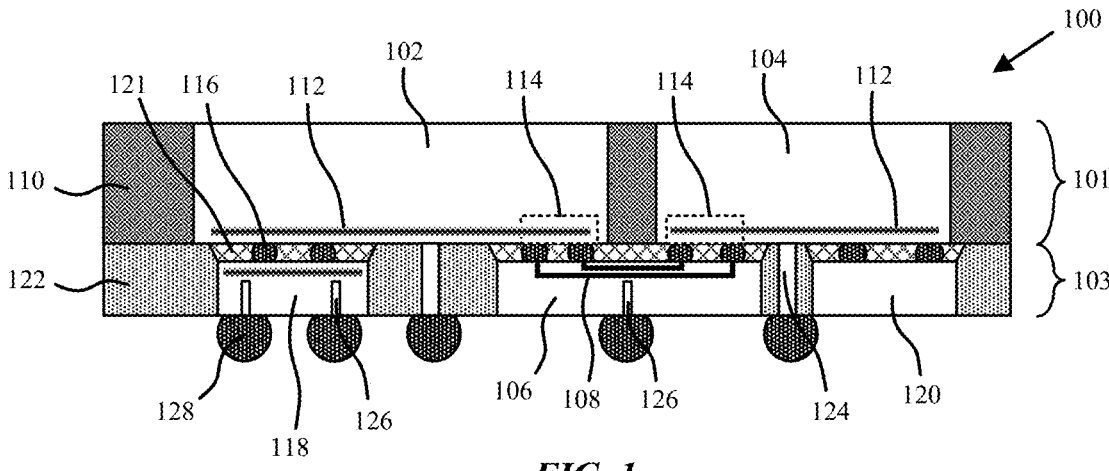
FIG. 1 is a schematic cross-sectional side view illustration of a semiconductor package including a local interconnect in accordance with an embodiment.

Embodiments describe semiconductor packages and methods of fabrication in which local interconnects are utilized for die-to-die interconnection.

In one aspect, embodiments describe a wafer reconstitution sequence in which multiple dies are reconstituted in a first package level, followed by placement of the local interconnect using a suitable technique such as microbumps, chip-on-wafer hybrid bonding or through via contacts. In some embodiments latency can be minimized by supporting direct path bonding. Alternatively, routing fanout can be accommodated between the dies and local interconnect. This can relax the local interconnect microbump pitch scaling.

In another aspect, embodiments describe local interconnect structures that integrate low dielectric constant (low-k) materials or air gaps. This may lower capacitance over distance (fF/mm), thereby reducing energy requirements, improve signal integrity, and potentially allow reduction of driver size and input/output area. Such lower capacitance over distance can also be traded for higher wiring density, and can provide communication over longer distance. An example may be system on chip (SoC) to High Bandwidth Memory (HBM) links that may span several mm. In an embodiment, the local interconnect wiring layers can be cantilevered across mechanical supports to hold the wires in place, as well as to support assembly loads. In some embodiments, the local interconnect includes stacked routing layers to increase bandwidth, provide additional mechanical support, or to provide additional devices such as passive devices (e.g. decoupling capacitors) or active devices. For example, the active devices may support logic, memory, caches, input/output (I/O), or power management integrated circuit (PMIC) functions. For example, integration of decoupling capacitors can allow for a power supply with low noise, while integration of active devices can allow chip core to chip core communication, bypassing going to the die edge saving on-chip SoC routing and power and latency budgets.

In another aspect, the local interconnects can be utilized for increased bandwidth of die-to-die communication, with mitigated latency. In one implementation, a local interconnect may be utilized as a communication bar between logic dies. In such an implementation, the local interconnect may be oriented toward communications, meeting bandwidth, power, latency and cost goals. The logic dies, such as system on chip (SOC), may include central processing units (CPU) or graphics processing units (GPU). In addition, the logic die periphery may be formatted to enable memory integration and other in/out (I/O) to other devices. Various cost control implementations may be included. For example, logic can be moved from a logic die to the communication bar to reduce cost of the logic dies. The communication bars can also provide voltage shifting capability. Use of communication bars can also allow flexibility for location of I/O terminals on the logic die, which do not have to be at the die edges. The local interconnects and communication bars in accordance with embodiments are not limited to connecting multiple dies. In an embodiment the communication bar can provide connection across a single die.

In an embodiment, the local interconnect functioning as a communication bar can includes a deserializer, a serializer, and a plurality of repeaters (e.g. active devices) between the deserializer and the serializer. The local interconnect can also support other signaling schemes such as pulse amplitude modulation (PAM), simultaneous bi-directional (SBD), low swing differential etc. as suitable. Local interconnect may support other non-silicon technologies such as, but not limited to, GaAs if appropriate. In accordance with embodiments, a local interconnect may provide level shifting capabilities as required.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", "spanning" and "on" as used herein may refer to a relative position of one layer with respect to other layers. One layer "over", "spanning" or "on" another layer or bonded "to" or in "contact" with another layer may be directly in contact with the other layer or may have one or more intervening layers. One layer "between" layers may be directly in contact with the layers or may have one or more intervening layers.

Referring now to FIG. 1 a cross-sectional side view illustration is provided of a semiconductor package 100 including a local interconnect 106 in accordance with an embodiment. As shown, the semiconductor package 100 may include a first die 102 and a second die 104 embedded in a gap fill layer 110, such as a polymer molding compound, inorganic material, etc. Dies 102, 104 may be perform a variety of functions depending upon specific application including, but not limited to, a graphics processing unit (GPU), central processing unit (CPU), artificial intelligence (AI), machine learning logic, signal processors, power management integrated circuit (PMIC), logic, memory, photonics, biochips, and any combinations thereof.

In an embodiment, dies 102, 104 may be placed face up on a carrier substrate, followed by encapsulation and RDL formation including Via 0 contact to the dies 102, 104. A local interconnect is then attached to the RDL. In the embodiment such as that illustrated in FIG. 1, a first package level 101 including the dies 102, 104 and gap fill layer 110 are formed in a wafer reconstitution process where the dies 102, 104 are placed face down on a carrier substrate and overmolded, followed by removal of the carrier substrate. Each of the dies 102, 104 may include active device regions 112, and at least one input/output region 114. In an embodiment additional components can then be mounted onto the reconstituted structure using suitable techniques such as flip chip bonding, chip-on-wafer hybrid bonding, wafer-on-wafer hybrid bonding, etc. In the exemplary embodiment the additional components can include another active die 118, integrated passive device 120, and local interconnect 106. This is exemplary, and embodiments are not limited to these specific components or combination of components.

Embodiments are compatible with both face up and face down process sequences, where factors such as placement accuracy versus cost tradeoff can be considered in selecting the fabrication sequence.

Still referring to FIG. 1, the components may be mounted utilizing a plurality of solder bumps 116 (which can be micro bumps) depending upon bump pitch. This may be followed by optional deposition of underfill material 121 then a gap fill layer 122, such as a polymer molding compound, inorganic material, etc. While solder bumping is illustrated, this is not a requirement. The components (inclusive of local interconnect 106) can be hybrid bonded, or bonded with dielectric-dielectric bonds and interconnected with through via connections (e.g. in a via-last approach). In accordance with embodiments, vertical interconnection to the first package level 101 can be with through vias 124 (e.g. through dielectric vias, through mold vias, etc), as well as through optional vias 126 (e.g. through silicon vias) through the various components in the second package level 103. Solder bumps 128 can then be dropped, followed by package 100 singulation.

In the particular embodiment illustrated in FIG. 1 the components in the second package level 103 are bonded directly to the dies 102, 104 in the first package level 101. However, this is merely exemplary and intermediate routing can be provided. Similarly, routing can be formed underneath the second package level 103 prior to application of the solder bumps 128.

Figure 2:
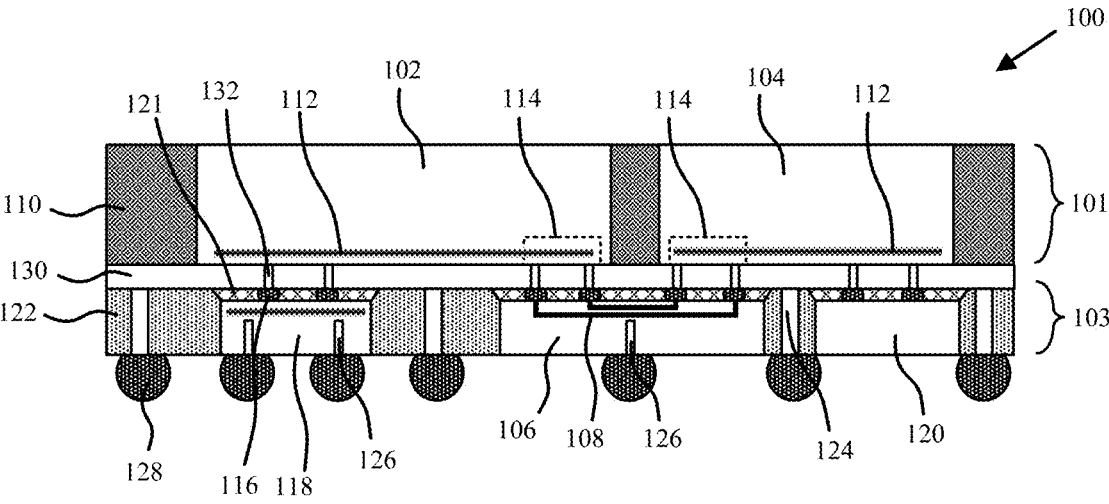
FIG. 2 is a schematic cross-sectional side view illustration of a semiconductor package including a local interconnect in accordance with an embodiment.

Referring now to FIG. 2, an intermediate layer 130 can be formed between the first package level 101 and the second package level 103. For example, the intermediate layer 130 can be a dielectric layer, an interposer, or multiple-layer redistribution layer (RDL) for example. In the illustrated embodiment, the intermediate layer 130 is an organic or inorganic dielectric layer including a plurality of vertical interconnects 132, which may be vias/landing pads through the dielectric layer. A direct interconnection path can minimize latency.

Figure 3A:
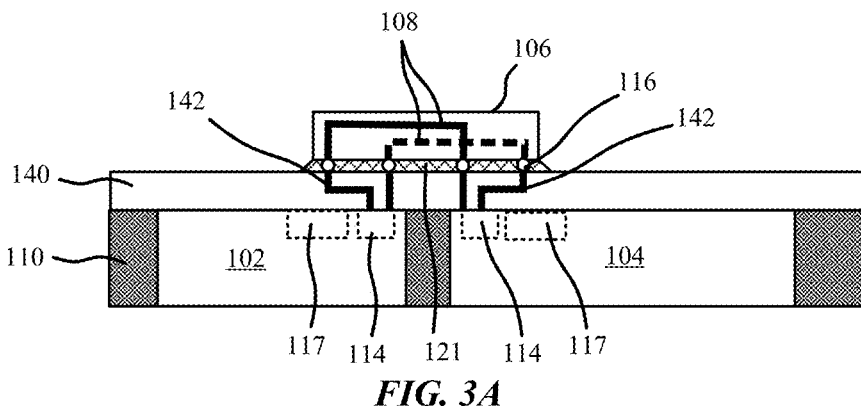
FIG. 3A is a schematic cross-sectional side view illustration of a semiconductor package redistribution layer with fanout routing and a local interconnect in accordance with an embodiment.
Figure 3B:
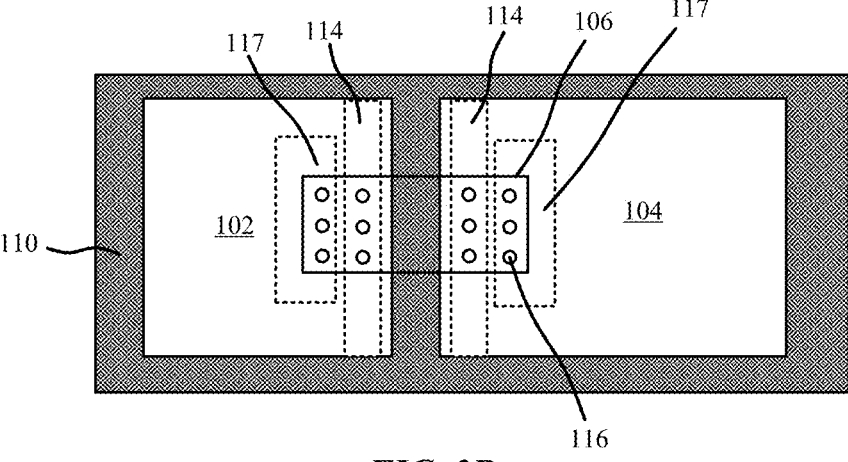
FIG. 3B is a schematic top view illustration of the local interconnect of FIG. 3A in accordance with an embodiment.

Referring now to FIGS. 3A-3B, FIG. 3A is a schematic cross-sectional side view illustration of a semiconductor package redistribution layer (RDL) 140 with fanout routing 142 and a local interconnect 106 in accordance with an embodiment; FIG. 3B is a schematic top view illustration the local interconnect 106 of FIG. 3A in accordance with an embodiment. In particular, the fanout routing 142 illustrated in FIGS. 3A-3B can reduce bond to bond effective area density. More specifically, the solder bumps 116 (micro bumps) for the local interconnect 106 are not confined to the I/O regions 114 and instead can encroach over core regions 117 (e.g. logic) of the dies 102, 104. In this manner I/O region area of the dies 102, 104 can be reduced.

Figures 4A, 4B:
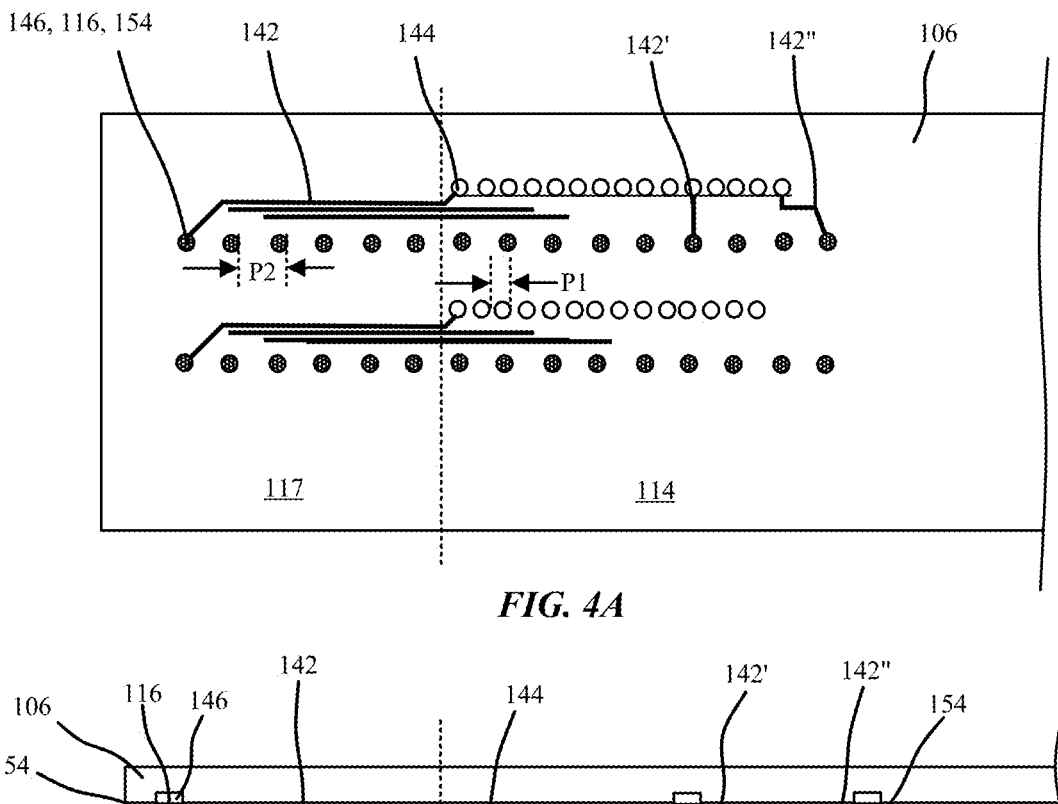
FIG. 4A is a schematic top view illustration of loosened local interconnect bump pitch in accordance with an embodiment.
FIG. 4B is a schematic cross-sectional side view illustration of a semiconductor package redistribution layer with fanout routing to support loosened local interconnect bump pitch in accordance with an embodiment.

Referring now to FIGS. 4A-4B, FIG. 4A is a schematic top view illustration of loosened local interconnect bump pitch in accordance with an embodiment; FIG. 4B is a schematic cross-sectional side view illustration of a semiconductor package redistribution layer with fanout routing to support loosened local interconnect bump pitch in accordance with an embodiment. FIGS. 4A-4B generally correspond to FIGS. 3A-3B. As shown, the die 102 includes a plurality of contact pads 144 over an input/output (I/O) region 114 characterized by a pad pitch (P1). The contact pads 144 can be connected with landing pads 146, 154 (and solder bumps 116) through fanout routing, which may be included within RDL 140 or local interconnect 106, for example. As shown, landing pads 154 may be located in the RDL 140. As shown, a reverse fanout routing 142 can allow for the landing pads 146, 154 (and solder bumps 116) to be located outside of the I/O region 114 and instead over another region, such as a core region 117 (e.g. logic). Thus, this reverse fanout routing 142 can be directed toward the die core rather than the die edge 119 between adjacent dies. This reverse fanout routing 142 can also be substantially orthogonal to the die edge 119. Also shown in FIGS. 4A-4B are vertical routing 142' and forward fanout routing 142". Furthermore, with such a configuration pad pitch (P2) of the landing pads 146 can be greater than a pad pitch (P1) of the contact pads 144 over the I/O region 114.

Figure 5A:
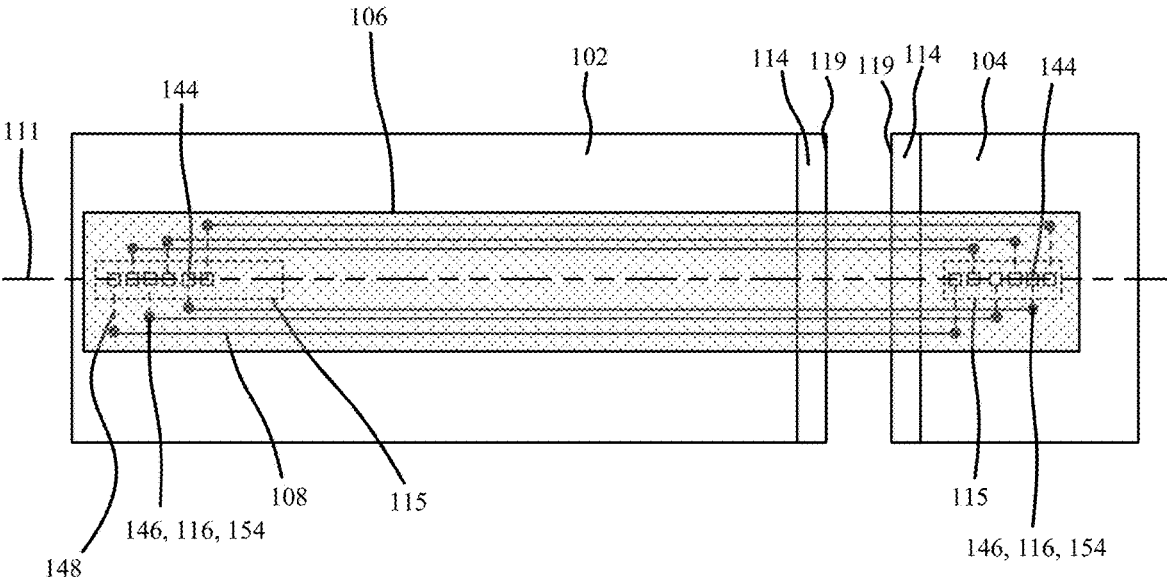
FIG. 5A is a schematic top view illustration of a long reach local interconnect in accordance with an embodiment.

Fanout routing can also facilitate long reach local interconnects. In the embodiment illustrated in FIG. 5A input/output (I/O) regions 115 are not confined to the die edges and may be near a central axis 111 of the dies, for example. While a central axis 111 is illustrated, the I/O region 115 areas can be distributed at any interior location of the die away from the die edges. In the illustrated embodiment fine die-to-die wiring 108 can be located within the local interconnect 106, while fanout wiring 148, located outside of the local interconnect 106, can extend orthogonal to the longitudinal length of the local interconnect 106 to connect the contact pads 144 of the dies 102 to landing pads 154 in the RDL 140. As such, die areas outside of I/O region areas can be used for other functions. Solder bumps 116, in turn may connect the RDL 140 landing pads 154 with landing pads 146 of the local interconnect 106 and in turn the die-to-die wiring extending the longitudinal length of the local interconnect 106. Thus, the fanout wiring 148 can be parallel to the die edges 119 between opposing I/O regions 114. Similarly, the die-to-die wiring 108 is orthogonal to the die edges 119 between opposing I/O regions 114. In accordance with embodiments, the fanout wiring 148 can be contained within the RDL 140 as previously described, or even within dies 102, 104. Where total die-to-die wiring 108 length reaches the order of several millimeters repeaters and capacitors may be included within the local interconnect 106 to preserve signal integrity, as well as improve latency. In the illustrated embodiment, the die-to-die wiring 108 lengths are approximately the same. As shown, the wiring can extend from a far contact pad 144 to near contact pad 144, and vice versa. Furthermore, since the fanout distance is small (e.g. for fanout wiring 148) this allows connect to deeper within the dies 102, 104 for a given allowable wiring distance.

Figure 5B:
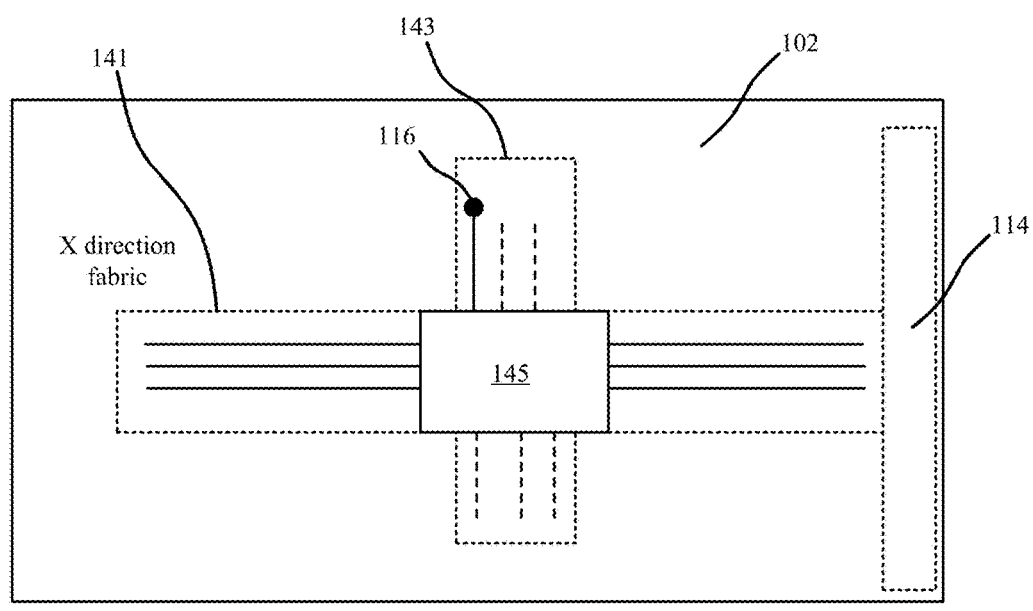
FIG. 5B is a schematic top view of die fabric with a repeater, routing or switching station and bonding side for local interconnect in accordance with an embodiment.

FIG. 5B is a schematic top view of die fabric with a repeater, routing or switching station 145 and bonding site for local interconnect in accordance with an embodiment. As shown, die fabric (or routing) may be x-direction fabric 141 and y-direction fabric 143 between or within various die cores. Where multiple cores are connected, repeater, routing or switching stations 145 can be provided along the fabric to include repeaters or switches, for example, when changing routing direction or lane. In accordance with embodiments, the repeater, routing or switching stations 145 can provide an option to route vertically to the local interconnect. In the illustrated embodiment, a local interconnect can be aligned with appropriate fabric within the die as shown by location of solder bump 116. This has a cost of an increased interfacing area to the local interconnect where an I/O region 115 is to be accommodated in or around the repeater, routing or switching stations 145 or fabric. However, this may avoid going to the die edge and associated fanout along the die shoreline, which costs latency, energy and area. Further, the local interconnect can have improved interconnect, low capacitance/mm, improved reach, latency and energy characteristics relative to the fabric strictly on the die (e.g. SoC).

Figure 6:
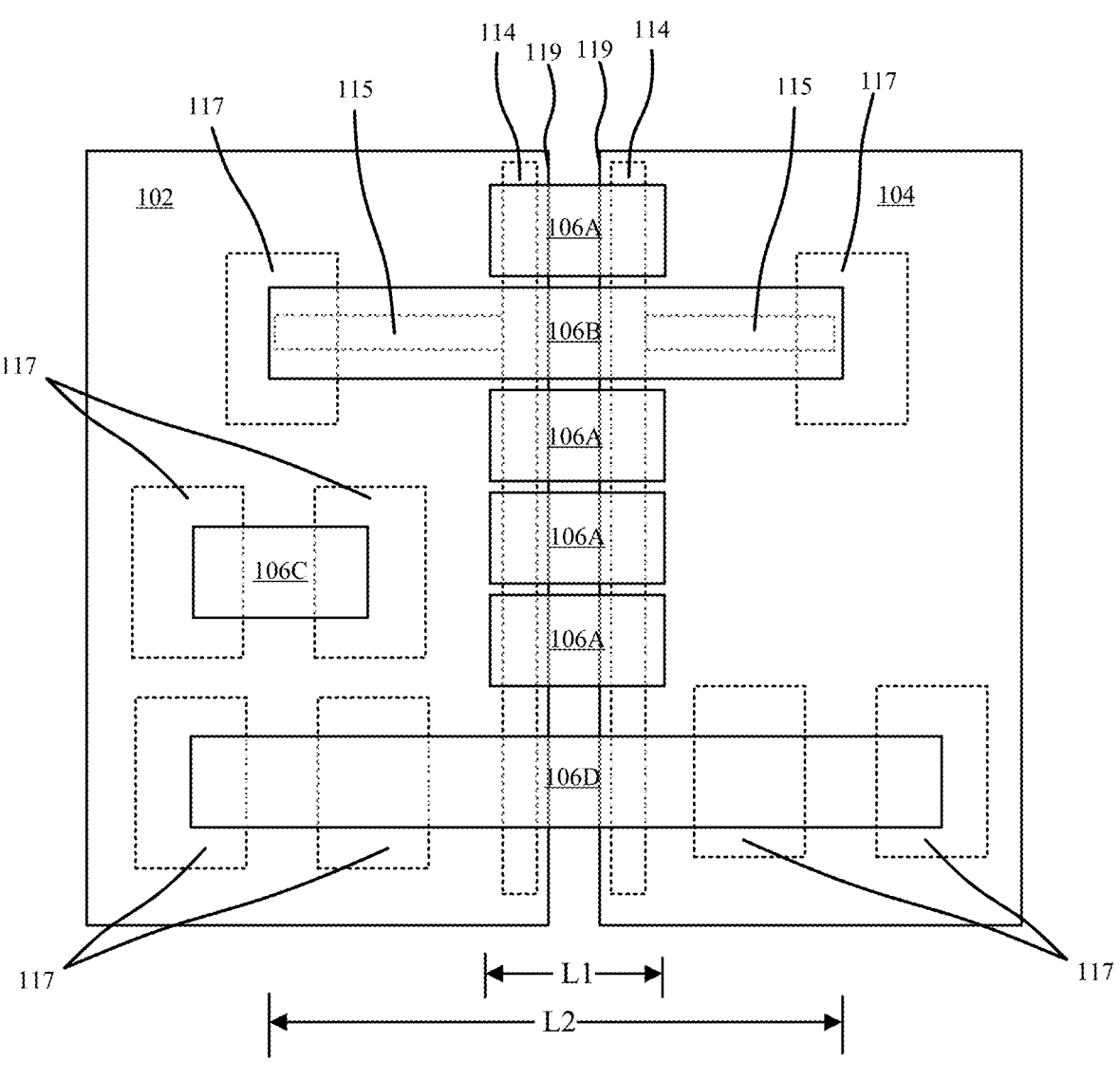
FIG. 6 is a schematic top view illustration of a plurality of local interconnects providing die-to-die interconnection in accordance with an embodiment.

Up until this point embodiments have been described illustrating only a single local interconnect 106 to provide die-to-die interconnection. However, multiple local interconnects can be incorporated into all embodiments. By design one may have one larger local interconnect, with subsequent larger ESD charge accumulation requiring larger ESD protection in the I/O circuit. One can break up the larger local interconnect into smaller local interconnect chiplets thereby reducing the ESD charge accumulation and ESD discharge during assembly, subsequently reducing ESD protection requirement on the I/O circuit. This lowers I/O region area and capacitance. FIG. 6 is a schematic top view illustration of a plurality of separate local interconnects 106A providing die-to-die interconnection in accordance with an embodiment. In such an embodiment, providing multiple, smaller local interconnects can mitigate electrostatic discharge (ESD) accumulation, allowing for smaller ESD protection circuits, saving capacitance and area. The plurality of separate local interconnects 106A, 106B can additionally have different longitudinal lengths (L1, L2), such as a long reach local interconnect of FIG. 5A for connecting core region 117 to core region 117 (e.g. core logic to core logic), and more typical reach local interconnect connecting I/O regions 114 along adjacent die edges 119. As an example, a long reach local interconnect 106B may be used to connect an SoC core region 117 to HBM core region 117. In an embodiment, the long reach local interconnect 106B may have thicker metal wiring layers and thicker insulator layers than those used for the shorter reach local interconnects 106A (e.g. between adjacent I/O regions 114).

The local interconnects in accordance with embodiments may also be used for intra-die connection. As shown in FIG. 6, local interconnect 106C can be used to connect multiple core regions 117, such as SoC to SoC core region within a die. As such, the internal die-to-die wiring within the local interconnect 106C is for intra-die connection rather than inter-die connection. The local interconnects can also be used for both intra-die connection and inter-die connection. As shown in FIG. 6 local interconnect 106D can be used to connect a variety of regions, including multiple core regions 117, as well as core region(s) 117 and/or I/O region(s) 114 of dies 102, 104.

Figure 7:
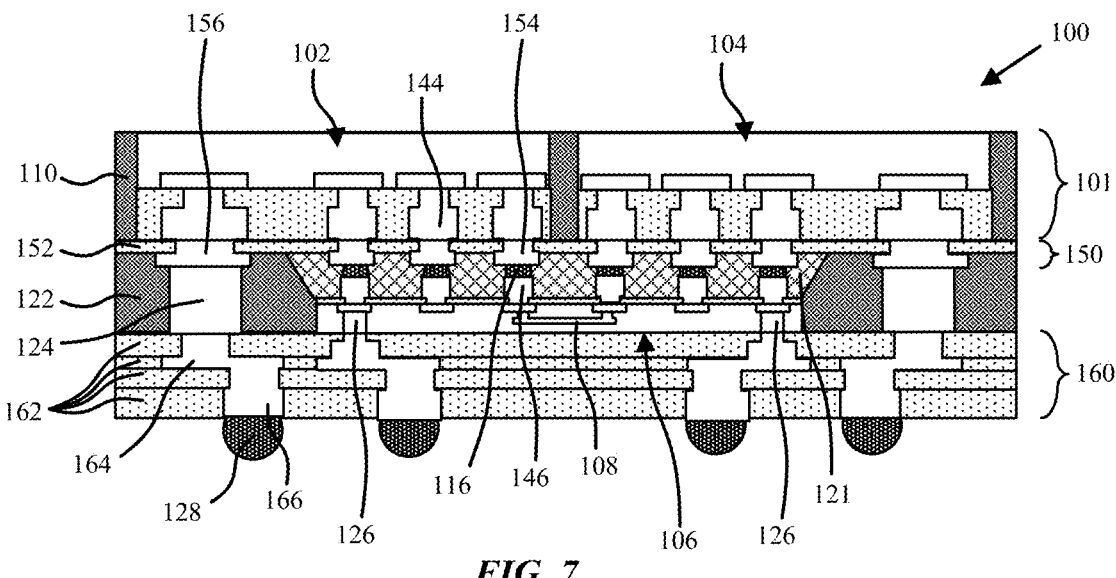
FIG. 7 is a schematic cross-sectional side view illustration of a semiconductor package including an embedded local interconnect in accordance with an embodiment.

The local interconnects 106 in accordance with embodiments can be integrated into a variety of semiconductor packages 100 in a variety of manners. FIG. 7 is a schematic cross-sectional side view illustration of a semiconductor package 100 including an embedded local interconnect 106 in accordance with an embodiment. As shown, dies 102 can be embedded in a gap fill layer 110 within a first package level 101 as previously described. For example, this may be achieved using a reconstitution sequence. An RDL 150 may then be optionally formed over the reconstituted structure. The RDL may be a single layer, such as the intermediate layer 130 of FIG. 2, or a multiple layer RDL including some used for fanout routing. In the illustrated embodiment, the RDL 150 includes a dielectric layer 152 and landing pads 154, 156 formed on contact pads 144 of the dies 102, 104. A local interconnect 106 can then be bonded to the landing pads 154, for example utilizing solder bumps 116 (e.g. micro bumps). Through vias 126 are optional. This can be followed by encapsulation with a gap fill layer 122, followed by via etching and plating of through vias 124. Alternatively, vertical interconnects can be formed prior to encapsulation. A planarization operation may then be performed, followed by the formation of a backside RDL 160. As shown, the backside RDL can include one or more dielectric layers 162 and metal wiring layer 164. Solder bumps can then be placed onto landing pads 166, followed by singulation of multiple semiconductor packages 100 from the reconstituted structure.

Figure 8:
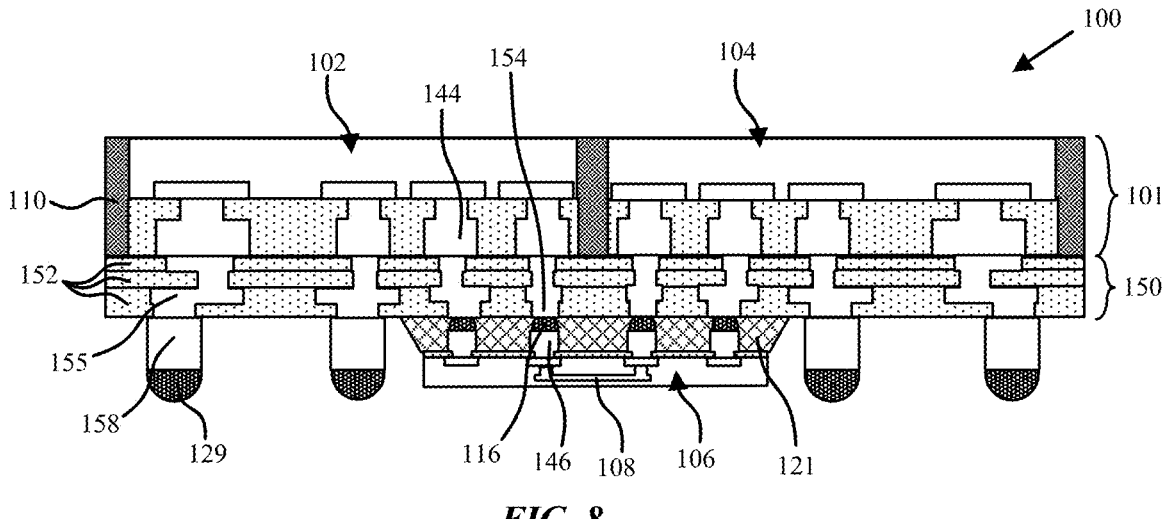
FIG. 8 is a schematic cross-sectional side view illustration of a semiconductor package including a local interconnect in accordance with an embodiment.

FIG. 8 is a schematic cross-sectional side view illustration of a semiconductor package 100 including an external local interconnect 106 in accordance with an embodiment. The semiconductor package 100 illustrated in FIG. 8 may be include a first package level 101 formed using previously a described reconstitution sequence. This is followed by optional formation of RDL 150 that can have one or more wiring layers. In the illustrated embodiment, the RDL 150 includes multiple dielectric layers 152 and wiring layers 155, which can include fanout wiring as well as stacked vias for more vertical interconnection. A plurality of metal stud contacts 158 may be formed on an underside of the RDL 150 to provide a stand-off height that can accommodate bonding of local interconnect 106 to landing pads 154 of the RDL 150. The local interconnect may then optionally be underfilled. Solder tips 129 may be placed onto the stud contacts 158, followed by insulation of multiple semiconductor packages 100.

Un until this point various routing configurations and semiconductor packages have been described. In the following description of FIGS. 9-16 various local interconnect structures are described. It is to be appreciated that any of the following local interconnect structures may be implemented with any of the various routing configurations and semiconductor packages described herein.

Figure 9:
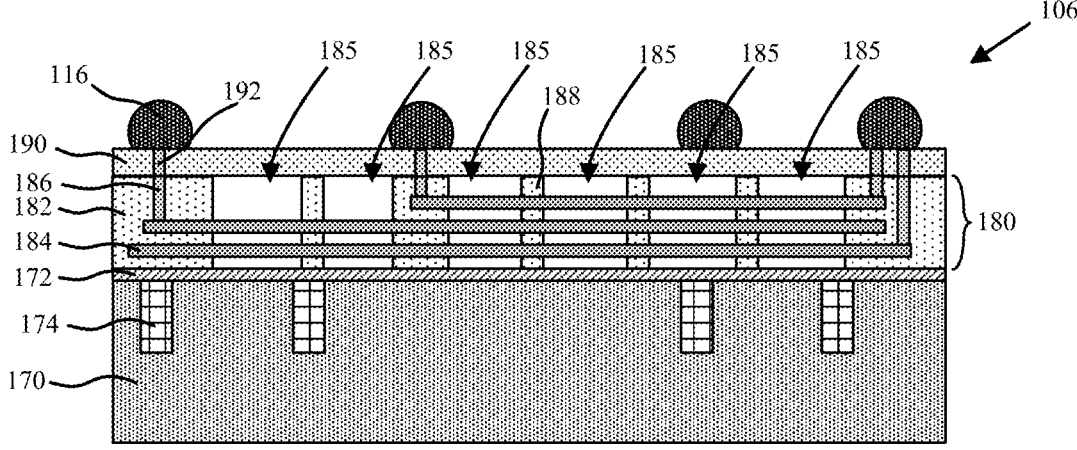
FIG. 9 is a schematic cross-sectional side view illustration of a local interconnect including cavities in accordance with an embodiment.
Figure 10:
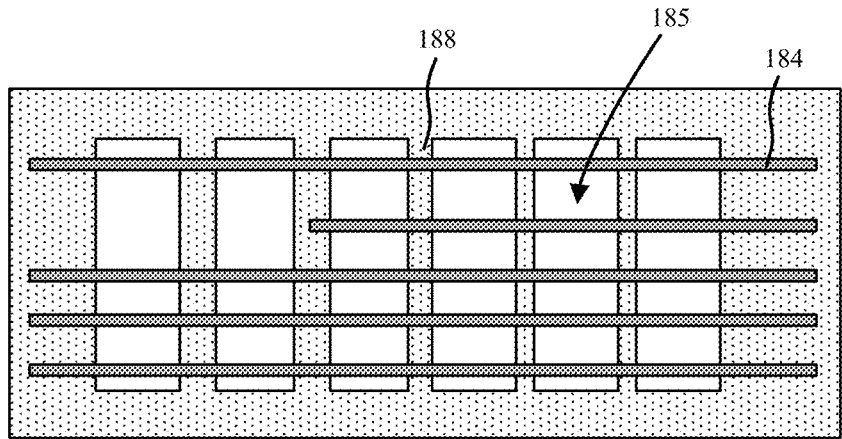
FIG. 10 is a schematic top view illustration of dielectric supports between cavities in accordance with an embodiment.

Referring now to FIGS. 9-10 schematic cross-sectional side view and top view illustrations are provided of a local interconnect including cavities in accordance with embodiments. As shown, the local interconnect 106 can include a base layer 170 and a routing layer 180. The base layer may be formed of a variety of rigid materials including glass and semiconductors, such as a silicon substrate. A device layer 172 including active devices (e.g. transistors) can optionally be located in a top portion of the base layer 170. In an embodiment deep trench capacitors (DTCs) 174 can be formed into the base layer (including the device layer 172). The routing layer 180 can include a plurality of insulator layers 182 and metal layers forming metal wires 184. One or more cavities 185 can be formed in the one or more insulator layers 182. As such the metal wires 184 can span across the cavities 185 in the routing layer 180. These metal wires 184 can support the die-to-die wiring 108 paths electrically connecting the dies 102, 104 previously described.

As shown in FIGS. 9-10, the one or more cavities 185 can be separated by support walls 188 formed of the insulator layers 182. The metal wires 184 in turn extend through the one or more support walls 188. In an embodiment, the cavities 185 are air cavities, and thus the metal wires 184 are cantilevered by the support walls 188 across the cavities 185. Various low-k dielectric materials (k<3) can also be used. Exemplary materials include ultra low-k (ULK) materials (k=2–3), extreme low-k (ELK) materials (k=2.5 or less), polymers, aerogels, etc. In accordance with embodiments, the cavity 185 areas (air gap or filled with low-k dielectric materials) may be maximized and the support wall 188 areas minimized to balance the low dielectric constant benefits and mechanical strength. In an embodiment, the cavities 185 are wider than the support walls 188 so that the metal wires 184 span a larger distance across than cavities 185 than within the support walls 188.

In order to provide further mechanical integrity a dielectric lid 190 can be bonded (e.g. in the case of air cavity) or deposited (e.g. in the case of low-k dielectric layers) to a top side of the routing layer 180. For example, this may be with a WoW dielectric bond, spin coat, chemical vapor deposition, etc. In an embodiment, the dielectric lid 190 is glass. Vias 192 may then be formed through the dielectric lid 190 to contact the metal wiring layers in the routing layer 180. Alternatively, pre-formed vias 192 can be bonded with vias 186 inside the routing layer 180 as illustrated. In accordance with embodiments, the support walls 188 can additionally support vias 186. While not separately illustrated, a metal-insulator-metal (MIM) capacitor may optionally be locate within the routing layer 180 of FIG. 9, space permitting. The MIM capacitors in accordance with embodiments may be planar or 3-dimensional.

Figure 11:
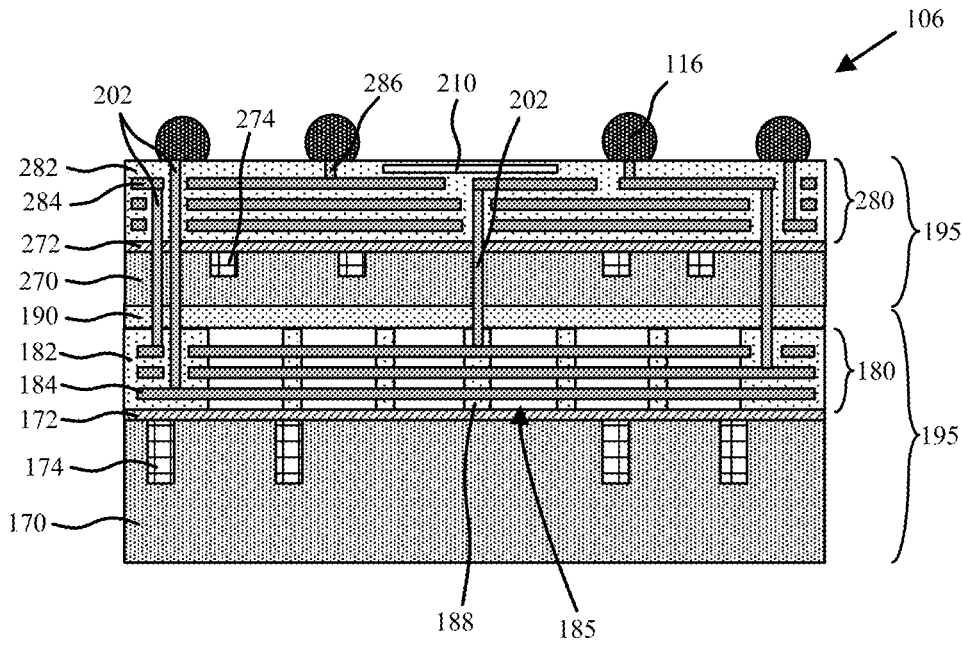
FIG. 11 is a schematic cross-sectional side view illustration of a local interconnect including face-to-back stacked routing layers in accordance with an embodiment.

FIG. 11 is a schematic cross-sectional side view illustration of a local interconnect 106 including face-to-back stacked routing layers 180 in accordance with an embodiment. Up until this point all local interconnects 106 described have been monolithic structures. For example, the local interconnect of FIG. 9 is a chiplet formed of a single base layer 170 supporting a routing layer 180. The local interconnects 106 in accordance with embodiments can include stacked chiplets 195. The embodiment illustrated in FIG. 11 is a face-to-back stacked assembly.

In the embodiment illustrated in FIG. 11, a second chiplet 195 includes a second base layer 270, second routing layer 280, second optional device layer 272, second dielectric layers 282, second metal wires 284. Second DTCs 274 can also be formed within the second base layer 270. Furthermore, an optional MIM capacitor 210 is illustrated as being formed in the second routing layer 280. As shown, a back side of the second base layer 270 can be bonded to the optional dielectric lid 190 with WoW dielectric bonds. In this embodiment, the second base layer 270 can be included for mechanical integrity or to support additional DTCs. In this embodiment, the second routing layer 280 does not include cavities 185. Alternatively, cavities 185 can also be included in the second routing layer 280. In yet another variation, cavities 185 can be included in the second routing layer 280, but not the routing layer 180. Vias 202, 286 can be formed to provide electrical routing between the multiple routing layers and solder bumps 116 (e.g. micro bumps). As shown the vias 202 in the stacked embodiments can connect the solder bumps 116 to either (or both) of the routing layer 180 and second routing layer 280. Vias 202 can also connect the routing layer 180 and second routing layer 280. In accordance with embodiments, the support walls 188 can additionally support vias 202. It is to be appreciated that any combination of the optional device layers 172, 272 and DTCs 174, 274 can be provided, such as no device layers, no DTCs, and combinations thereof.

Figure 12:
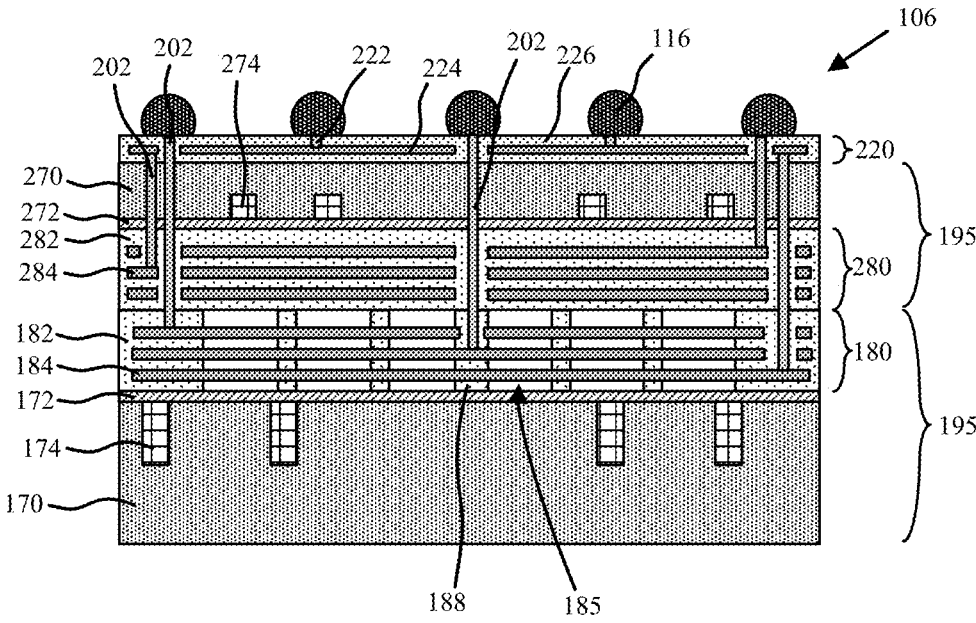
FIG. 12 is a schematic cross-sectional side view illustration of a local interconnect including face-to-face stacked routing layers in accordance with an embodiment.

FIG. 12 is a schematic cross-sectional side view illustration of a local interconnect 106 including face-to-face stacked routing layers in accordance with an embodiment. In this embodiment, a second routing layer 280 is bonded to the routing layer 180 (e.g. WoW dielectric bond) and the second base layer 270 is on an opposite side of the second routing layer 280 than the routing layer 180. In this configuration an RDL 220 including metal wiring layer 224, dielectric layers 226 and vias 222 can be formed over the second base layer 270 to support fanout routing for solder bump 116 (e.g. micro bump) attach.

Figure 13:
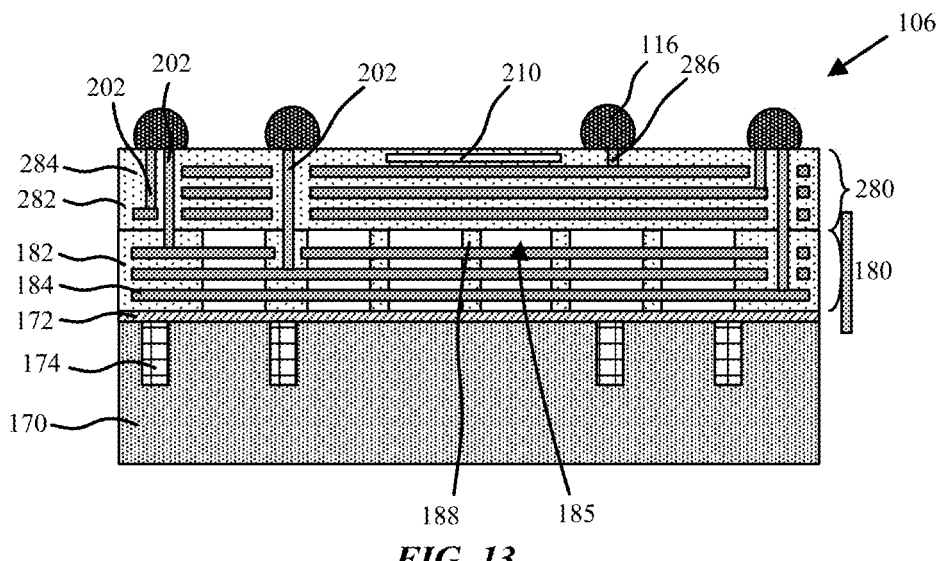
FIG. 13 is a schematic cross-sectional side view illustration of a local interconnect including face-to-face stacked routing layers with a base layer removed in accordance with an embodiment.

It is not necessary to retain the base layers in a stacked assembly. FIG. 13 is a schematic cross-sectional side view illustration of a local interconnect 106 including face-to-face stacked routing layers with the second base layer removed in accordance with an embodiment. For example, the fabrication sequence for the local interconnect 106 of FIG. 13 may proceed similarly as that of FIG. 12, followed by removal of the second base layer 270 after WoW bonding of the second routing layer 280 to routing layer 180.

Figure 14:
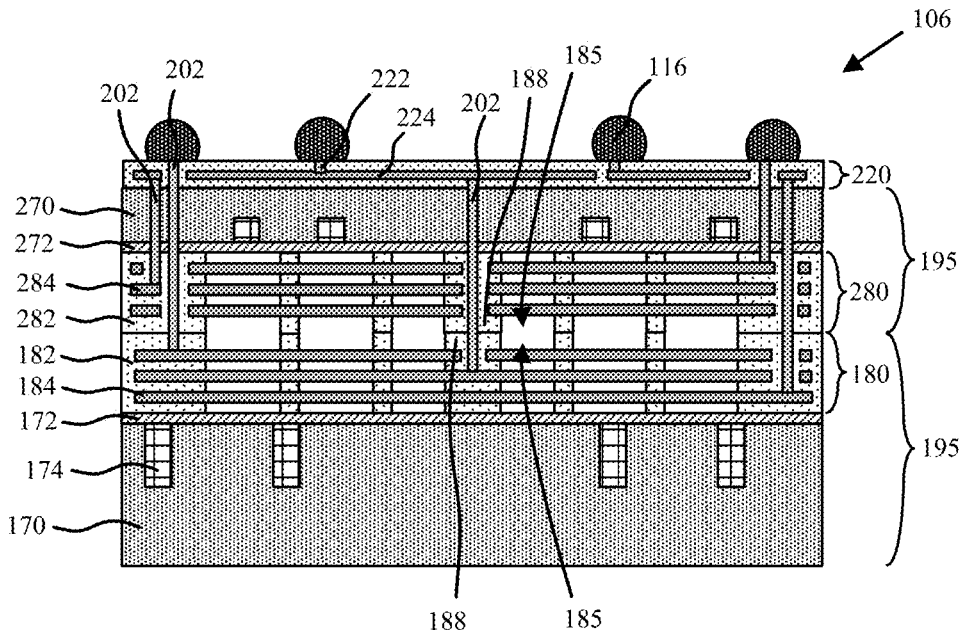
FIG. 14 is a schematic cross-sectional side view illustration of a local interconnect including two face-to-face stacked routing layers with cavities in accordance with an embodiment.
Figure 15:
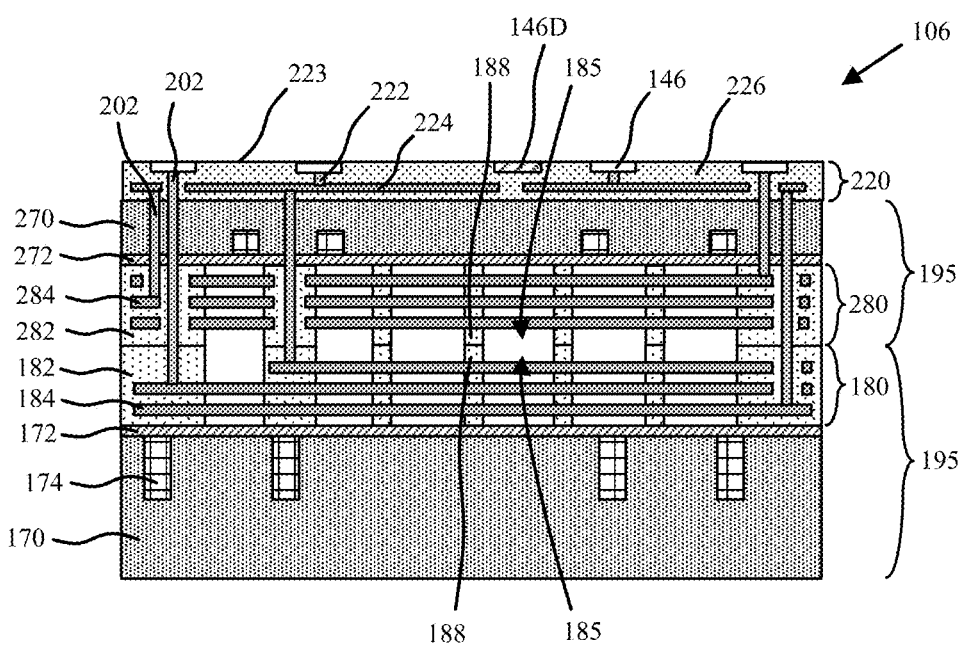
FIG. 15 is a schematic cross-sectional side view illustration of a local interconnect conditioned for hybrid bonding in accordance with an embodiment.

As previously described, the second routing layer 280 may also include cavities 185. FIG. 14 is a schematic cross-sectional side view illustration of a local interconnect 106 including two face-to-face stacked routing layers with cavities 185 in accordance with an embodiment. For example, the fabrication sequence for the local interconnect 106 of FIG. 14 may proceed similarly as that of FIG. 12. This is exemplary however, and cavities 185 can be formed in any of the routing layers 180 and/or second routing layers 280.

It is to be appreciated that while embodiments have been described and illustrated herein in which solder bumping (e.g. micro bumps) has been used for hybrid bonding. For example, in the embodiment illustrated in FIG. 15 the RDL 220 includes a planarized surface 223 spanning a dielectric layer 226 and landing pad 146. Any of the local interconnects 106 and other components in the same package level can be hybrid bonded in accordance with embodiments.

Figure 16:
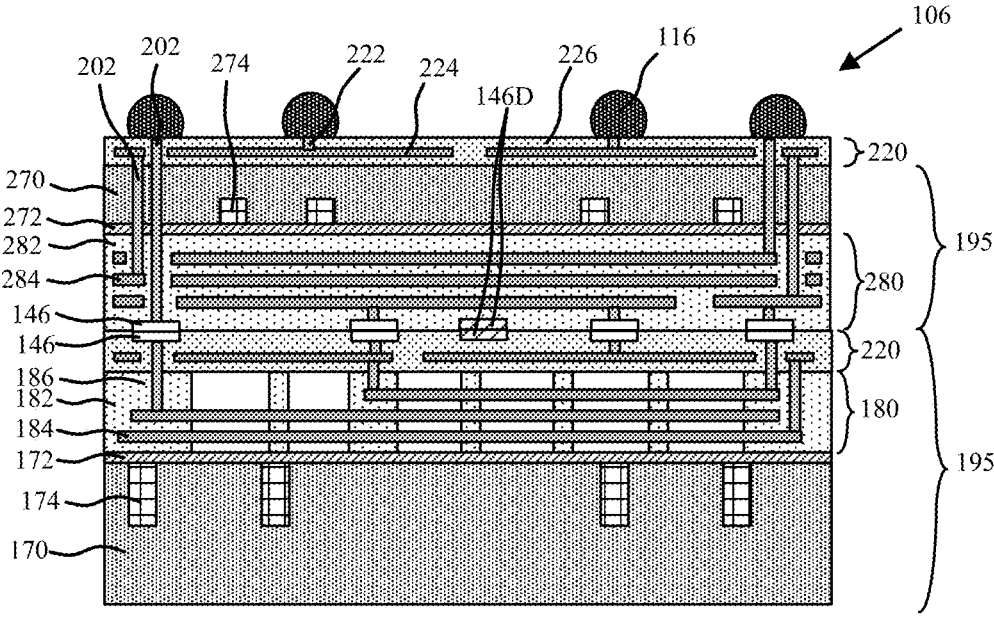
FIG. 16 is a schematic cross-sectional side view illustration of a local interconnect including hybrid bonded stacked chiplets in accordance with an embodiment.

FIG. 16 is a schematic cross-sectional side view illustration of a local interconnect 106 including hybrid bonded stacked chiplets 195 in accordance with an embodiment. As shown, face to face landing pads 146 can be metal-metal bonded in addition to bonding of dielectric layers. Dummy bond pads 146D may additionally be inserted along the bonding interface to ensure galvanic corrosion control, while preparing the chiplet or local interconnect hybrid bond pads.

In utilizing the various aspects of the embodiments, it would become apparent to one skilled in the art that combinations or variations of the above embodiments are possible for forming semiconductor packages with local interconnects. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A semiconductor package comprising:
    a first die;
    a second die; and a local interconnect electrically connecting the first die
and the second die, wherein the local interconnect
includes a base layer and a routing layer supported by
the base layer, the routing layer including a metal wire
spanning across a cavity in the routing layer;
wherein a die-to-die routing path electrically connecting
the first die and the second die includes the metal wire
spanning across the cavity.

2. The semiconductor package of claim 1, wherein the
base layer is a silicon layer.

3. The semiconductor package of claim 1, wherein
routing layer includes a plurality of support walls, and the
metal wire extends through the plurality of support walls.

4. The semiconductor package of claim 1, wherein the
cavity is an air cavity.

5. The semiconductor package of claim 1, wherein the
cavity is filled with a material characterized by a dielectric
constant less than 3.

6. The semiconductor package of claim 1, wherein the
base layer includes a plurality of deep trench capacitors.

7. The semiconductor package of claim 1, wherein the
routing layer includes a metal-insulator-metal (MIM)
capacitor.

8. The semiconductor package of claim 1, wherein the
cavity is both over and underneath the metal wire spanning
across the cavity.

9. The semiconductor package of claim 8, further comprising a second routing layer over the routing layer, wherein
the second routing layer comprise a metal-insulator-metal
(MIM) capacitor.

10. The semiconductor package of claim 8, further comprising a second routing layer over the routing layer and a
second base layer between the second routing layer and the
routing layer.

11. The semiconductor package of claim 8, further comprising a second routing layer over the routing layer and a
second base layer, wherein the second routing layer is
bonded to the routing layer, and the second base layer is on
an opposite side of the second routing layer than the routing
layer.

12. The semiconductor package of claim 8, further comprising a second routing layer over the routing layer and a
plurality of deep trench capacitors in the routing layer or the
second routing layer, and a plurality of active devices in the
base layer.

13. The semiconductor package of claim 1:
wherein the first die includes a first plurality of contact
pads over a first input/output region along a central axis
of the first die, and a second plurality of contact pads
over a second input/output region of the first die;
further comprising a redistribution layer (RDL) spanning
over the first die, the redistribution layer including a
plurality of landing pads electrically connected to the
first plurality of contact pads and the second plurality of
contact pads with a fanout wiring;
wherein the local interconnect is connected to the plurality of landing pads of the RDL; and
wherein the local interconnect is characterized by a longitudinal length spanning across the first die, and the
fanout wiring of the RDL is orthogonal to the longitudinal length.

14. The semiconductor package of claim 13, wherein:
the metal wire of the local interconnect spans along the
longitudinal length;
the local interconnect is a communication bar;
the local interconnect is connected a first core region of
the first die to a second core region of the first die; and
the local interconnect includes active devices.

15. The semiconductor package of claim 1:
wherein the local interconnect is part of a plurality of
separate local interconnects electrically connecting the
first die and the second die, wherein each separate local
interconnect includes a base layer and a routing layer
supported by the base layer, the routing layer including
die-to-die routing electrically connecting the first die
and the second die.

16. The semiconductor package of claim 15, wherein the
plurality of separate local interconnects includes a first local
interconnect characterized by a first longitudinal length
spanning across the first die and the second die, and a second
local interconnect characterized by a second longitudinal
length spanning across the first die and the second die,
wherein the second longitudinal length is longer than the
first longitudinal length.

17. A semiconductor package comprising:
a first die including a first plurality of contact pads over
a first input/output region adjacent a first edge of the
first die;
a second die including a second plurality of contact pads
over a second input/output region adjacent a second
edge of the second die;
a redistribution layer (RDL) spanning over the first die
and the second die, the redistribution layer including a
plurality of landing pads electrically connected to the
first plurality of contact pads and the second plurality of
contact pads, wherein the plurality of landing pads is
characterized by a larger pad pitch between pads than
the first plurality of contact pads and the second plurality of contact pads; and
a local interconnect bonded to the plurality of landing
pads of the RDL.

18. The semiconductor package of claim 17, wherein a
first portion of the plurality of landing pads spans over a first
logic region of the first die.

19. The semiconductor package of claim 17, wherein the
local interconnect includes a base layer and a routing layer
supported by the base layer, the routing layer including a
metal wire spanning across a cavity in the routing layer.

20. A semiconductor package comprising:
a first die including a first plurality of contact pads over
a first input/output region along a central axis of the
first die;
a second die including a second plurality of contact pads
over a second input/output region of the second die;
a redistribution layer (RDL) spanning over the first die
and the second die, the redistribution layer including a
plurality of landing pads electrically connected to the
first plurality of contact pads and the second plurality of
contact pads with a fanout wiring; and
a local interconnect connected to the plurality of landing
pads of the RDL;
wherein the local interconnect is characterized by a longitudinal length spanning across the first die and the
second die, and the fanout wiring of the RDL extends
in a direction that is orthogonal to the longitudinal
length and toward a die edge of the first die that is
parallel to the longitudinal length.

21. The semiconductor package of claim 20, wherein the
local interconnect includes die-to-die wiring along the longitudinal length.

22. The semiconductor package of claim 20, wherein the
local interconnect is a communication bar.

23. The semiconductor package of claim 20, wherein the
local interconnect is connected a first core region of the first
die to a second core region of the second die.

24. The semiconductor package of claim 20, wherein the local interconnect includes active devices.

25. The semiconductor package of claim 20, further comprising an active die adjacent the local interconnect, and underneath the first die to provide communication function to the first die.

26. The semiconductor package of claim 20, further comprising an integrated passive device adjacent the local interconnect, and underneath the second die.

\* \* \* \* \*